(12) United States Patent
Leeper (10) Patent No.: US 9,441,825 B2
(45) Date of Patent: Sep. 13, 2016

(54) HEAT-DISSIPATING SOCKET FOR LIGHTING FIXTURES

(71) Applicant: Jonathan Leeper, Indianapolis, IN (US)

(72) Inventor: Jonathan Leeper, Indianapolis, IN (US)

(*) Notice: Subject to any disclaimer, the term of this patent is extended or adjusted under 35 U.S.C. 154(b) by 70 days.

(21) Appl. No.: 14/554,232

(22) Filed: Nov. 26, 2014

(65) Prior Publication Data

US 2016/0146447 A1     May 26, 2016

(51) Int. Cl.
| | |
|---|---|
| *F21V 23/06* | (2006.01) |
| *F21V 29/00* | (2015.01) |
| *F21V 29/51* | (2015.01) |
| *F21V 23/00* | (2015.01) |
| *H01L 23/40* | (2006.01) |
| *F21Y 101/02* | (2006.01) |
| *F21V 29/70* | (2015.01) |

(52) U.S. Cl.
CPC ............ *F21V 29/51* (2015.01); *F21V 23/003* (2013.01); *F21V 23/06* (2013.01); *H01L 23/40* (2013.01); *F21V 29/70* (2015.01); *F21Y 2101/02* (2013.01); *H01L 2023/4037* (2013.01)

(58) Field of Classification Search
CPC .. F21V 23/003; F21V 23/006; F21V 23/007; F21V 23/008; F21V 23/06; F21V 29/51; F21V 29/56; F21V 29/70; H01L 23/3736; H01L 23/373; H01L 23/40; H01L 23/4006; H01L 2023/4037; H01L 2023/405
USPC ................................. 439/56, 485, 487, 699.2
See application file for complete search history.

(56) References Cited

U.S. PATENT DOCUMENTS

| | | | | |
|---|---|---|---|---|
| 7,553,162 B2* | 6/2009 | Isoda | .................. | F21K 9/00 362/249.01 |
| 7,852,015 B1* | 12/2010 | Yen | .................. | F21V 23/06 257/97 |
| 8,591,062 B2* | 11/2013 | Hussell | .................. | F21V 7/00 362/219 |
| 8,714,785 B2* | 5/2014 | Osada | .................. | F21S 8/02 362/241 |
| 8,814,399 B2* | 8/2014 | Osawa | .................. | F21V 23/06 362/365 |
| 2012/0206927 A1* | 8/2012 | Miyahara | .............. | F21V 29/004 362/382 |
| 2015/0285482 A1* | 10/2015 | Wang | .................. | F28D 15/02 165/104.21 |

* cited by examiner

*Primary Examiner* — Alan Cariaso
(74) *Attorney, Agent, or Firm* — C. John Brannon; Brannon Sowers & Cracraft PC (57) ABSTRACT

An LED lighting assembly, including a socket member operable to electrically communicate with a solid-state lighting element, at least two electrical connections extending into the socket member for electrically communicating with a solid-state lighting element, at least two electrical receivers extending into the socket member and capable of electrical communication with the at least two electrical connections, a differentiation groove embedded in the socket member, a driver element in electrical communication with the at least one socket member, and a heat-dissipating member operationally connected to the socket member. Other implementations include securing and energizing the solid-state lighting element by inserting the solid-state lighting element into the socket member and twisting; polarity-specific electrical connections using uniquely sized electric receivers and/or electrical connectors; and active and/or passive heat dissipation.

4 Claims, 9 Drawing Sheets

HEAT-DISSIPATING SOCKET FOR LIGHTING FIXTURES

TECHNICAL FIELD

The novel technology relates to the field of lighting, and, more particularly, to heat-dissipating light-emitting diode (LED) socket assemblies for lighting fixtures.

BACKGROUND

Solid-state lighting systems use solid state light sources, such as light emitting diodes (LEDs), and are increasingly being used to replace other, traditional lighting systems, such as incandescent or fluorescent lamps. Solid-state light sources offer several advantages over the traditional lamps, such as rapid turn-on, rapid cycling (on-off-on) times, long useful life span, low power consumption, narrow-emitted light bandwidths that eliminate the need for color filters to provide desired colors, and so on.

LED lighting systems require what is known as a driver. An LED driver is a self-contained power supply that has outputs matched to the electrical requirements of the LED(s). LED drivers may enable dimming by means of pulse-width modulation circuits. Further, drivers may have more than one channel for separate control of different LEDs or LED arrays. The driver typically consists of a printed circuit board (PCB) for connecting the LED to an electrical power supply. The PCB driver may be mounted on the base of an LED lighting fixture or, alternatively, may be positioned remotely from the LED fixture. Many residential and commercial lighting applications rely on traditional screw-based sockets intended for incandescent bulbs or fixtures. These traditional sockets are not optimally designed to dissipate heat generated by higher output LED fixtures. In order to be used with traditional screw-based sockets, LED fixtures must contain both the LED lighting package and the driver in a form resembling the traditional incandescent bulb. Many existing screw-based sockets can only support lower output LED fixtures comparable to incandescent bulbs rated at 60 watts or less.

Thus, there remains a need for an improved LED lighting array. The present novel technology addresses this need.

DETAILED DESCRIPTION

For the purposes of promoting an understanding of the principles of the novel technology and presenting its currently understood best mode of operation, reference will now be made to the embodiments illustrated in the drawings and specific language will be used to describe the same. It will nevertheless be understood that no limitation of the scope of the novel technology is thereby intended, with such alterations and further modifications in the illustrated devices and such further applications of the principles of the novel technology as illustrated therein being contemplated as would normally occur to one skilled in the art to which the novel technology relates. The illustrated embodiments in the drawings are intended to be exemplary only.

Figure 1A:
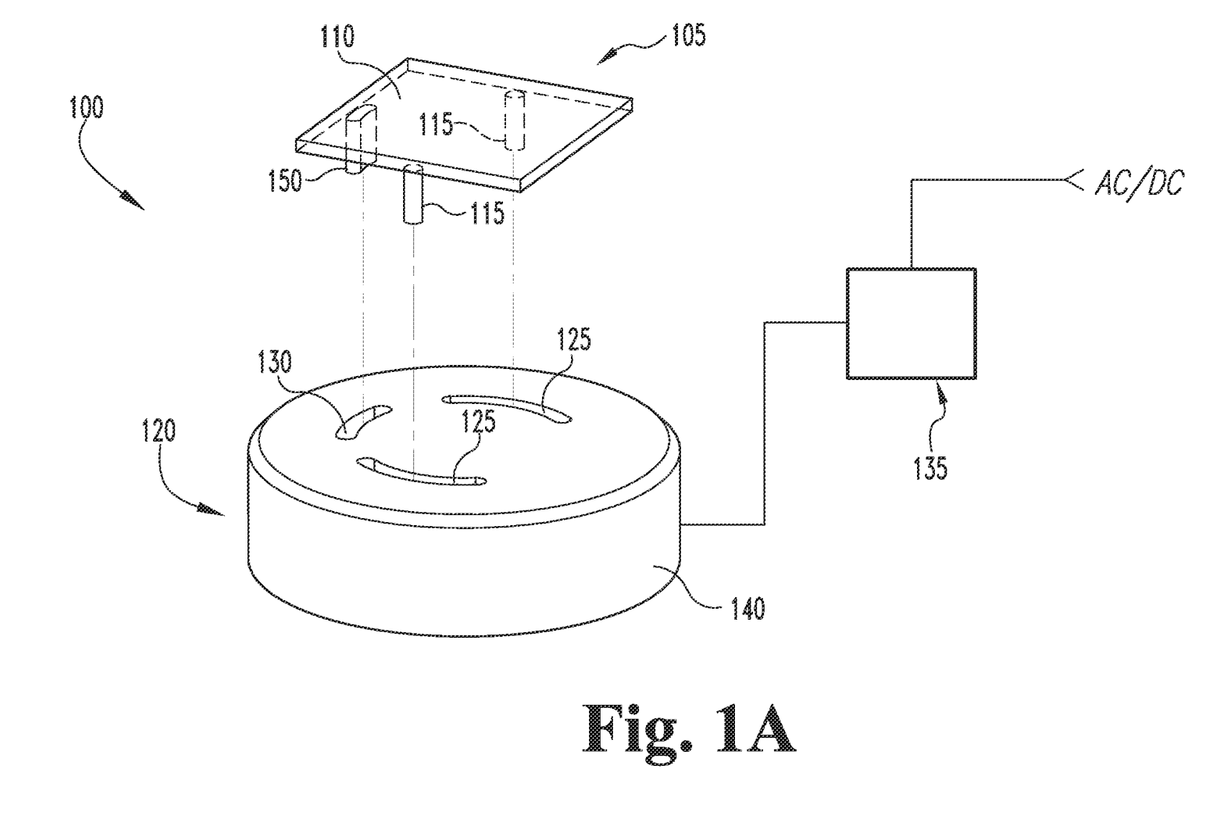
FIG. 1A is a first perspective view of an LED socket assembly according to a first embodiment of the present novel technology.
Figure 1B:
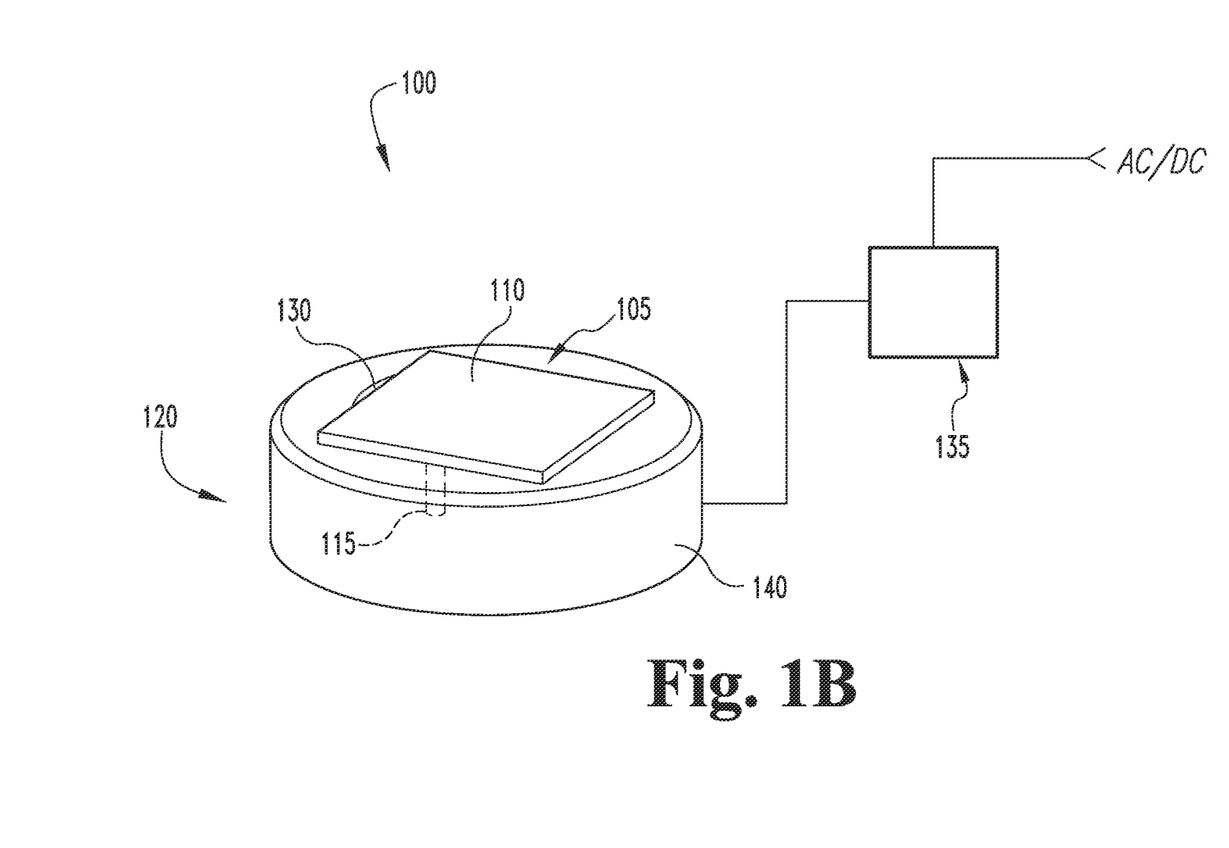
FIG. 1B is a second prospective view of the embodiment of FIG. 1A.

As illustrated in FIGS. 1A-1B, the present novel technology includes a lighting system 100 for supplying power to one or more light-emitting diode (LED) modules 105. Each module 105 typically includes an LED 110 and two LED electrical connections 115 extending therefrom for providing electrical power to energize the LED 110 connected in electric communication therewith. The system typically includes a socket module 120 and two socket electrical receivers 125 mateable to the connectors 115. The socket member 120 may also include a differentiation groove 130 for limiting the power output type and/or polarity orientation of a to-be-connected LED module 105. The system typically further includes at least one driver/ballast 135 and at least one heat-dissipating element 140, both operationally connected to the socket member 120. FIG. 1A illustrates the LED module 105 as disconnected from the socket module 120, and FIG. 1B illustrates a connection of the LED module 105 to the socket module 120.

Typically, the socket member 120 is connected in electric communication with a driver 135. The driver 135 is in turn connected to an electrical source, such as a direct current power supply or an alternate current socket. A user may obtain and place an LED module 105 into the socket module 120 such that the LED electrical connections 115 insert into the socket electrical receivers 125, allowing electric communication between the socket electrical receivers 125 of the socket module (which is in turn connected to the driver 135 electrical connection) and the LED module 105. This supply of electricity to the LED module 105 energizes one or more LEDs 110 located on the LED module 105, thus illuminating the LED 110 and shining light therefrom. Dimming of the LED module 105 may occur through, but is not limited to, constant current reduction dimming (CCR), triode for alternating current (TRIAC dimming), forward-phase dimming, reverse-phase dimming, etc.

The transduction of electrical energy to light by the LED is not 100% efficient, and thus thermal energy is generated as a by-product. However, as discussed above, present lighting sockets are insufficient to effectively capture and dissipate the thermal output of many higher-wattage LED-based lighting solutions resulting in excessive operating temperatures of the fixtures. To dissipate the thermal load of such higher-wattage solutions, the present novel technology utilizes a heat-dissipating element 140 operably connected to the socket module 120. The heat-dissipating element 140 may typically include, but is not limited to, heat sink and heat pipe structures. For example, heat generated by an LED module 105 may be transferred through the LED electrical connections 115, socket module 120, and/or the socket electrical receivers 125 to the heat-dissipating element 140. The heat-dissipating element 140 may then dissipate the transferred thermal load by several methods, including but not limited to, relocation of thermal energy through a heat pipe system, distributing thermal energy across a greater surface area of a heat sink, or the like.

Additionally, to maximize thermal dissipation efficacy, specific socket modules 120 may be configured to fall within preexisting power schemes. For example, the socket modules 120 and/or driver 135 may be fused or otherwise limited to accept incoming power within an Underwriters Laboratories (UL) Class II (UL 1310) power standard. Further, this standard may be further limited to a specific band of output power (e.g., from 8-100 watts or the like). Limitation to such bands not only facilitates operation within established standards, easing manufacturing of components, but also increases safety and efficiency of the thermal output to avoid thermal runaway.

Additionally, in some implementations, the socket module 120 and the heat-dissipating element 140 may be combined or unitary to more readily facilitate thermal transfer. For example, instead of transferring heat through the length of the socket module 120—which may not be as effective for thermal dissipation—and then into the heat-dissipating element 140, the heat-dissipating element 140 may instead be formed integrally with the socket module 120 itself. In some instances, the entire socket module 120/heat-dissipating element 140 combination may be made from material with high thermal conductivity properties (e.g., copper, aluminum, etc.) with the electrical channels being electrically insulated to pass through the socket module 120 body to the socket electrical receivers 125. This electrical insulation may, for example, be accomplished using polymer or ceramic coatings and/or sleeves separating the electrical connections from the metal of the socket module 120/heat-dissipating element 140 combination.

In some embodiments, active cooling may also be used to dissipate the thermal load. For example, a fan or water-based cooling system may more readily transfer the thermal load from the heat sink and/or heat pipe to circulating air or water by convection. Such implementations may allow greater-wattage applications with a smaller physical footprint by reducing the quantity of heat-dissipating material and/or removing the thermal load to a remote heat-dissipation unit (not shown).

In some embodiments, the socket module 120 may also include a differentiation groove 130 that may selectively prevent connecting an LED module 105 to a socket module 120. This selective prevention would occur through the inclusion of a differentiation structure 150 (differentiation member; differentiation element), such as a pin, tab, wedge or the like, connected to and extending from the LED module 105. This differentiation structure 150 may selectively allow or prevent the LED module 105 from fitting into the differentiation groove 130 by means of length, width, shape, or other suitable interference means. For example, to prevent one type of LED module 105 from being placed in a specific socket or group of sockets, the differentiation structure 150 may be longer or wider than the differentiation groove 130 will accommodate. In some implementations, the differentiation structure 150 may be present on some LED modules 105 but not on other LED modules 105. For example, an LED module 105 designed to operate at 10 watts may include a differentiation structure that may fit into a corresponding differentiation groove 130 on a socket module 120, allowing the 10-watt LED module 105 to properly mate with the socket module 120. Conversely, a socket module 120 designed for LED modules up to 100 watts may not include a differentiation groove 130 and a 100-watt LED module may not include a differentiation structure 150; thus, the 10-watt LED module 105's differentiation structure 150 would not allow the 10-watt LED module 105 to fit in the 100-watt socket module 120, but the 100-watt LED module 105 (which lacks the differentiation structure 150) may fit into either the 10-watt or the 100-watt socket module 120.

In other implementations, for easier identification of the type of groove-structure interface compatibility, a shape or other easily identifiable means may be used. For example, a star-shaped differentiation structure 150 would typically not allow an LED module 105 to fit within a differentiation groove 130 designed for a thin circular peg and would also serve to direct users to a socket module 120 with a star-shaped differentiation groove 130.

This selective prevention may occur, for example to prevent a lesser-wattage LED module (e.g., rated for maximum of 20 watts) from being placed in a socket module 120 designed to only receive LED modules capable of outputting 60 watts or greater, thereby damaging or destroying the lesser-wattage LED module. Additionally, such selection may be used to guide a user to select a specific type of LED module for a specific purpose (e.g., using a narrow-lens module instead of a dispersing-lens for spotlighting in a theater environment).

Further, in some embodiments, the LED 110 is polar, requiring the pins 115 to connect into the receivers 125 in a predetermined orientation that, if switched, would prevent the LED from energizing. The presence of the groove 130 and the mating differentiation structure 150 serves to only allow connection of the LED module 105 and the socket member 120 in one—and typically only one—correct polar orientation.

In some other implementations, the LED 110 may be placed in the proper polar orientation using uniquely sized electrical connections. For example, pins 115 may each have a different diameter, shape, length, taper, and/or any other distinguishing physical characteristic so as to make each pin 110 distinct from the other pin(s) 110. The socket electrical receivers 125 each may then be respectively configured (e.g., having a diameter, shape, length, taper, etc.) to properly receive and electrically communicate with each unique pin 110. Thus, a pin 110 with a 1-millimeter diameter may properly mate with a 1-millimeter socket electrical receiver 125, but it may not properly mate with 0.5- and/or 1.5-millimeter socket electrical receivers 125.

Figure 2:
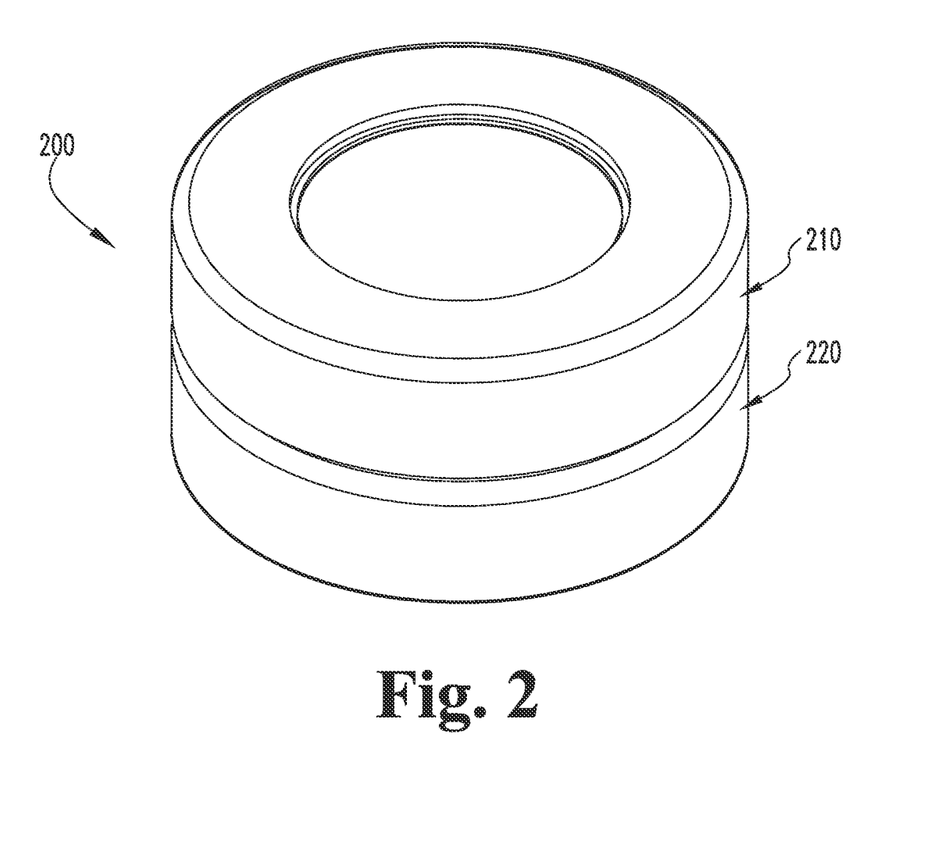
FIG. 2 is a perspective view of second embodiment of an LED socket assembly including an LED module and an LED socket module.

FIG. 2 depicts a second embodiment alternative LED socket assembly 200 typically including an alternative LED module 210 and an alternative LED socket module 220. LED module 210 typically connects to LED socket module 220 to provide electric communication to LED module 210. This connection may be provided by a number of mechanisms including, but not limited to, bayonet mounts, threads, pins and grooves, flanges, etc. capable of providing electric communication. Once a connection is accomplished, the LED module 210 may be secured to the LED socket module 220 such that the LED module 210 may remain in electric communication with the LED socket module 220 even when the LED socket assembly 200 may be inverted.

Other implementations may provide selectively secured and/or unsecured connections where the LED module 210 may disconnect from the LED socket module 220 upon the presence of certain predetermined conditions. For example, an LED module 210 may use actuated clips to secure itself into the LED socket module 220, but upon a signal from an operator the clips may deactuate, causing the LED module 210 to disconnect from the LED socket module. In another example, the LED module 210 may connect to the LED socket module 220 by a simple pin-and-receiver mechanism, where the LED module 210 may be simply inserted and/or removed from the LED socket module 220 without torqueing the LED module 210 into the LED socket module 220 to provide electric communication.

Figure 3A:
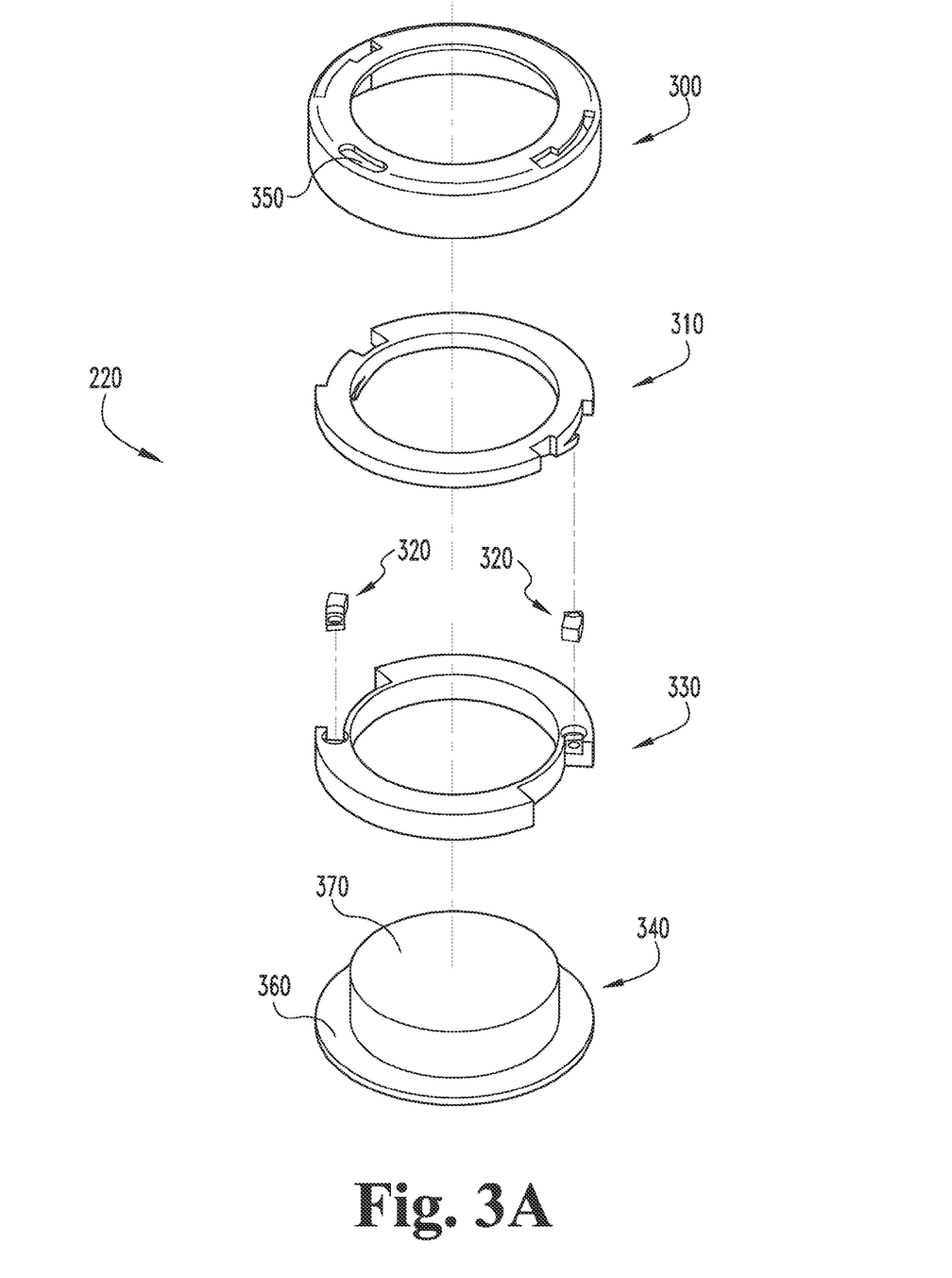
FIG. 3A is an exploded view of the LED socket module of the embodiment of FIG. 2.
Figure 3B:
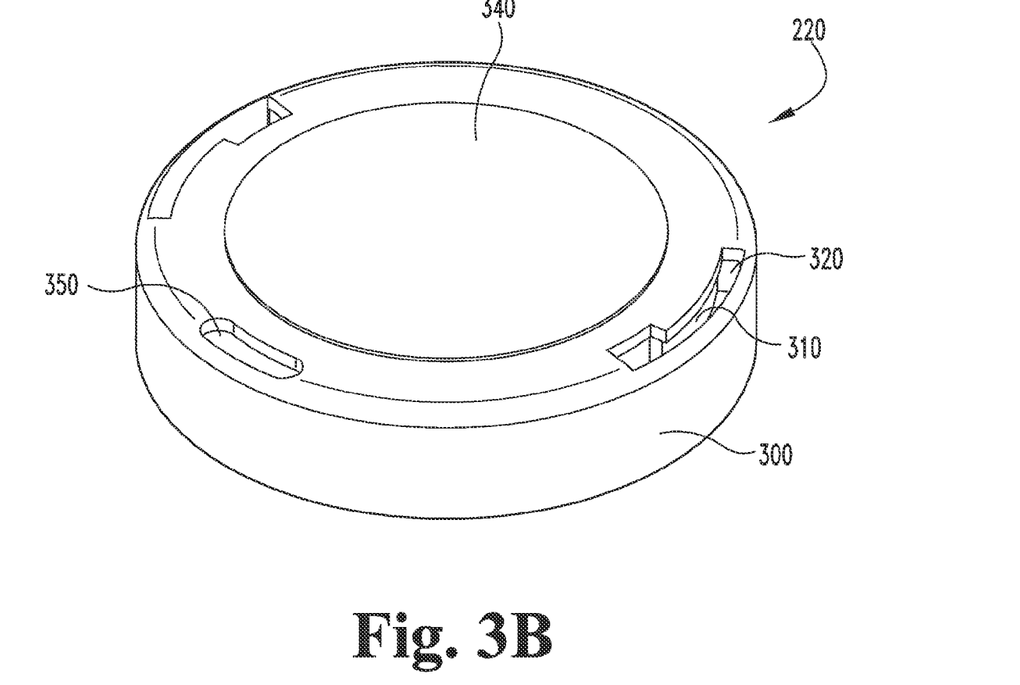
FIG. 3B is a first perspective view of the LED socket module.
Figure 3C:
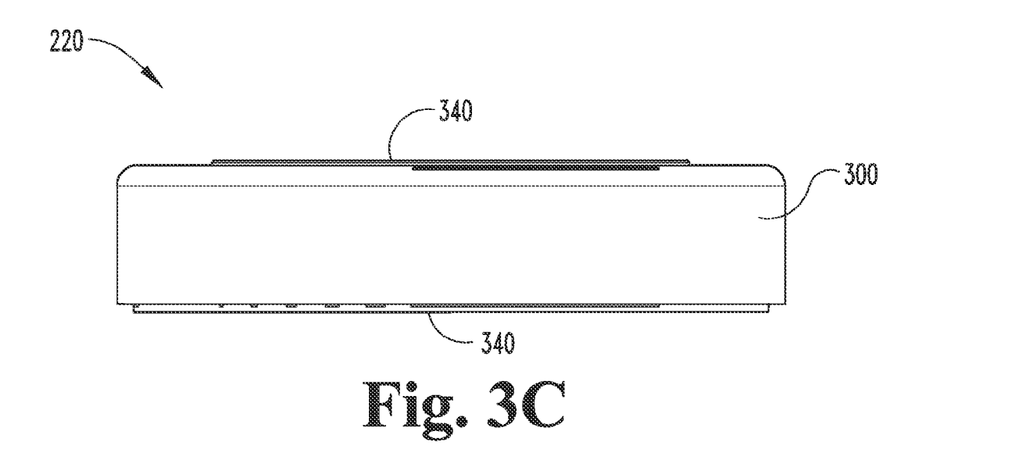
FIG. 3C is a second perspective view of the LED socket module from the side.

FIGS. 3A-3C depict another embodiment of the alternative LED socket module 220 typically including cover 300, locking ring 310, socket electrical receivers 320, contact ring 330, heatsink base 340, differentiation receiver 350, base portion 360, and vertical portion 370. Specifically, FIG. 3A depicts an exploded view of the alternative LED socket module 220; FIG. 3B depicts a top view of the alternative LED socket module 220; and FIG. 3C depicts a side view of the alternative LED socket module 220.

As depicted in FIG. 3A, heatsink base 340 typically includes a base portion 360 and a vertical portion 370, the vertical portion 370 extending though and surrounded by contact ring 330, locking ring 310, and cover 300. Socket electrical receivers 320 typically may be inset—in whole or in part—within contact ring 330, and locking ring 310 typically may retain socket electrical receivers 320 with contact ring 330 and/or heatsink base 340. Cover 300 wholly or partially encloses the LED socket module 220 components, but typically may have one or more openings to receive differentiation structure 150 via differentiation receiver 350; LED electrical connections 115; vertical portion 370 of heatsink base 340; and any other desirable connection. In some implementations, the heatsink base 340 may be a unitary, integral piece (i.e., heatsink base 340 may include both base portion 360 and vertical portion 370, such as where heatsink base 340 may be a unitary cylinder, truncated cone, etc.), while in other implementations, heatsink base 340 may be multiple components in thermal communication (e.g., base portion 360 lockingly interconnected with vertical portion 370; base portion 360 soldered to vertical portion 370; etc.).

FIG. 3B depicts LED socket module 220 in an assembled form, including cover 300, locking ring 310, socket electrical receivers 320, contact ring 330, heatsink base 340, and differentiation receiver 350. Heatsink base 340 typically extends above cover 300 to provide a raised thermal mating surface. In some implementations, heatsink base 340 may inset and/or be three-dimensionally contoured (e.g., in a pyramid, hemisphere, etc.). The inset and/or three-dimensionally contoured configuration may be used, for example, to provide greater thermal contact area and/or greater security between LED module 210 and LED socket module 220. Electrical communication to socket electrical receivers 320 typically may be provided by aligning LED module 210 above LED socket module 220, inserting LED module electrical connections 530 (described below) a sufficient distance into the LED socket module 220 and then torqueing the LED module 210—in FIG. 3B's case, in a counterclockwise motion—to allow LED module electrical connections 530 to electrically communicate with socket electrical receivers 320. In some implementations, LED socket module 220 may receive LED module electrical connections 530 in such an orientation as to allow clockwise torque of LED module 210 to allow LED module electrical connections 530 to electrically communicate with socket electrical receivers 320. For example, LED module 210 may be aligned below LED socket module 220 and then LED module electrical connections 530 may be inserted a sufficient distance into the LED socket module 220. In another example, locking ring 310 may be in a reversed orientation such that FIG. 3B's depicted locking ring 310's widest open point on the left side of the LED socket module 220 is located at the bottom of FIG. 3B page (and vice versa for locking ring 310 on the right side of FIG. 3B). Further, in some implementations, LED module 210 may be torqued in a counterclockwise or clockwise motion to connect to LED socket module 220. For example, there may be a centrally located aperture on each locking ring 310 with one or more socket electrical receivers 320 on each distal end of the locking ring 310, one or more socket electrical receivers 320 in each respective locking right 310 connected to the same polarity (i.e., one locking ring 310 housing socket electrical receivers 320 connected to a positive electrical flow, while the other locking ring 310 connects to a negative electrical flow). Thus, a user may align LED module 210 above or below LED socket module 220, insert LED module electrical connections 530 a sufficient distance into the LED socket module 220, and then torque the LED module 210 in either a clockwise or counterclockwise motion to bring LED module electrical connections 530 into electrical communication with socket electrical receivers 320.

FIG. 3C depicts a side view of LED socket module 220, including cover 300 enclosing the exterior of the LED socket module 220 and heatsink base 340 extending both above and below cover 300 to provide a clear thermal interface surface. As above, the heatsink base 340 may be inset and/or three-dimensionally contoured as desired.

Figure 4:
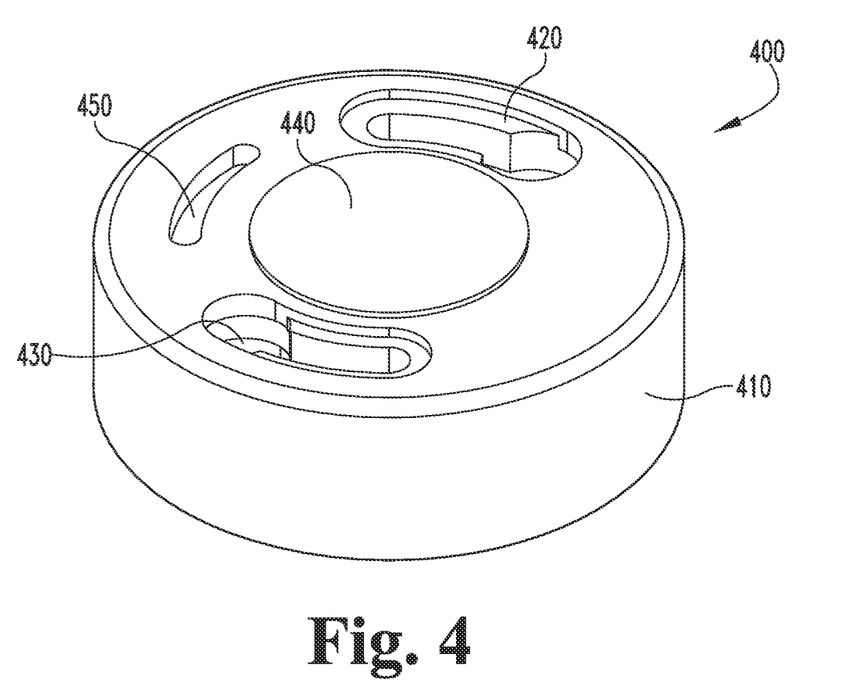
FIG. 4 is a perspective view of a second embodiment of the LED socket module.

FIG. 4 depicts another embodiment of an LED socket module 400 typically including cover 410, locking ring 420, contact ring 430, heatsink base 440, and differentiation receiver 450. As with FIGS. 3B-3C, heatsink base 440 typically extends above LED socket module 400 and extends above and below cover 410. Openings through cover 410 typically may be curved ovoids and nonuniformly sized so as to only accept compliant LED module electrical connections 530. For example, one opening may be 0.5 centimeter in width, and the other opening may be 0.25 centimeter. Such shaping and sizing of openings may allow the LED socket module 400 to accept LED module electrical connections 530 of an appropriate dimension and may result in ensuring proper polarity of electric communication to LED module components (e.g., LED 510), limiting lesser-rated components into a higher-rated LED socket module 400 (e.g., prevent 10-watt LED module in a 100-watt LED socket module), etc. Locking ring 420, contact ring 430, and differentiation receiver 450 may be contoured so that as an LED module electrical connector secures into LED socket module 400, the LED module's heat transfer component(s) (e.g., LED thermal contact 540, described below) make incremental, increasing contact with heatsink base 440.

Figure 5A:
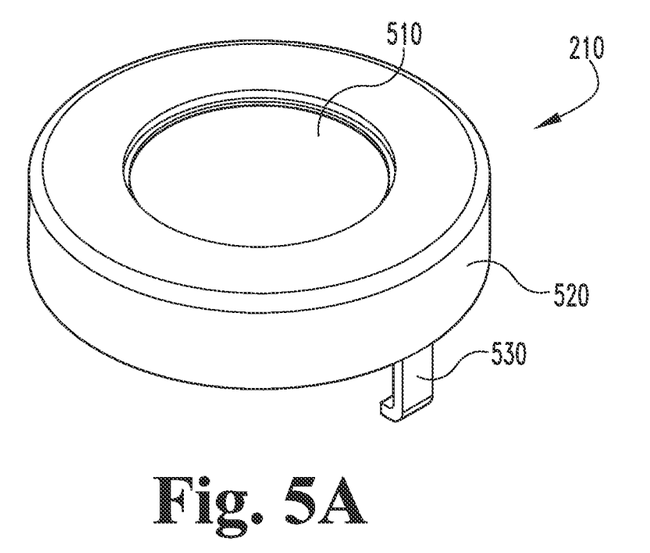
FIG. 5A is a first perspective view of the top of the LED module of the embodiment of FIG. 2.
Figure 5B:
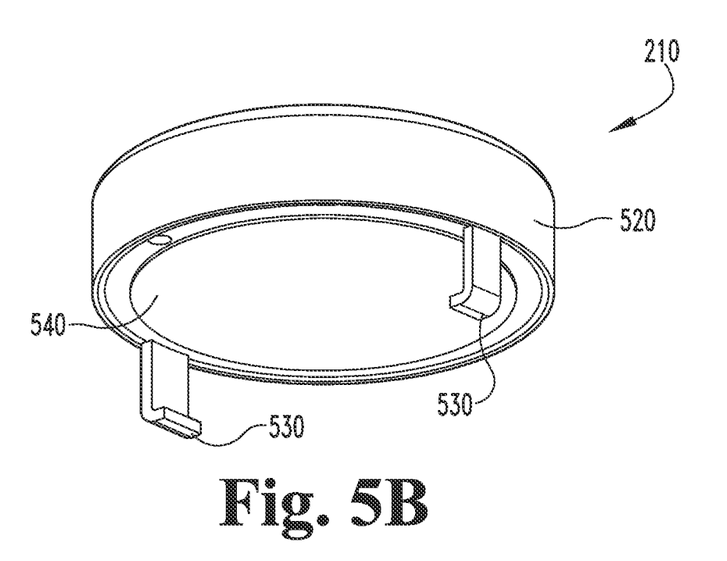
FIG. 5B second perspective view of the bottom of the LED module of the embodiment of FIG. 2.

FIGS. 5A-5B depict another embodiment of the LED module 210 typically including LED 510, LED module cover 520, LED module electrical connections 530, and LED thermal contact 540. Specifically, FIG. 5A depicts a top view of the LED module 210, and FIG. 5B depicts a bottom view of the LED module 210.

FIG. 5A depicts a top view of the LED module 210. LED 510 may typically be a single LED or an LED package (e.g., a system-on-a-chip (SoC), chip-on-board (CoB), etc.). LED module cover 520 may insulate and/or protect LED module 210 components. In some implementations, provide lenses, filters, and/or other additional components (not shown) to modify light emitted from LED 510. LED 510 is in electric communication with LED module electrical connection(s) 530, which may in turn be in electric communication with an LED socket module (e.g., LED socket module 400).

FIG. 5B depicts a bottom view of the LED module 210, illustrating an example of sizing and positioning of LED module electrical connection(s) 530 and LED thermal contact 540. While two LED module electrical connections 530 may provide electric communication between LED 510 and an LED socket module, such connection may similarly be provided by a single LED module electrical connection 530 (e.g., wherein the side is negative and the terminal end is positive; one side is positive and the opposite side is negative; etc.) or with three or more LED module electrical connections 530 (e.g., two independent positive connections and two independent negative connections; a positive connection, a negative connection, and a ground connection; etc.). LED thermal contact 540 thermally communicates thermal energy from LED 510 to a heat-dissipating member (e.g., heat-dissipating element 140, heatsink base 340, etc.) and may extend or be inset in LED socket assembly 210.

Figure 6A:
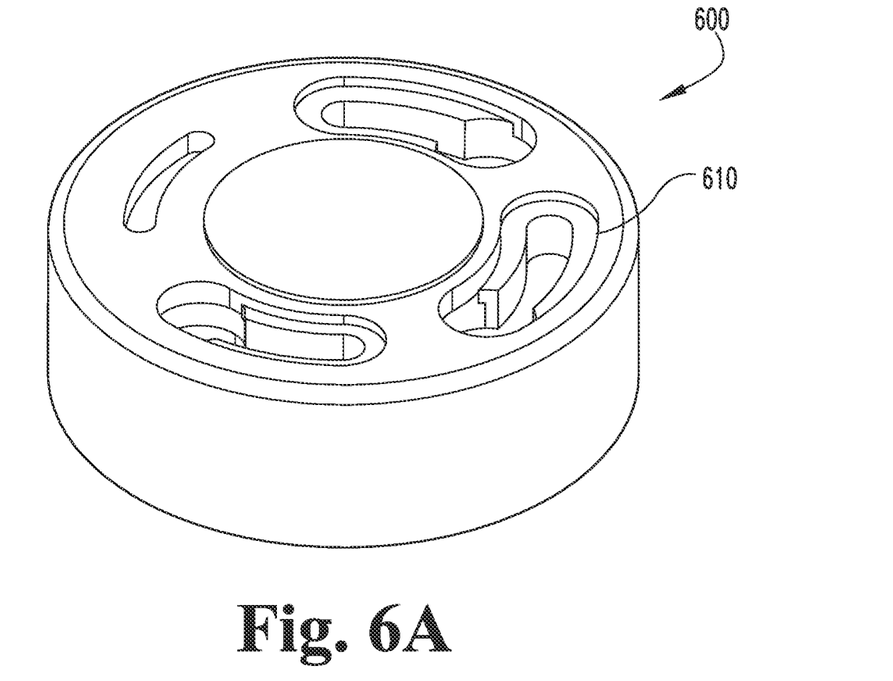
FIG. 6A is a first perspective view of an LED socket module including an auxiliary socket electrical receiver(s).
Figure 6B:
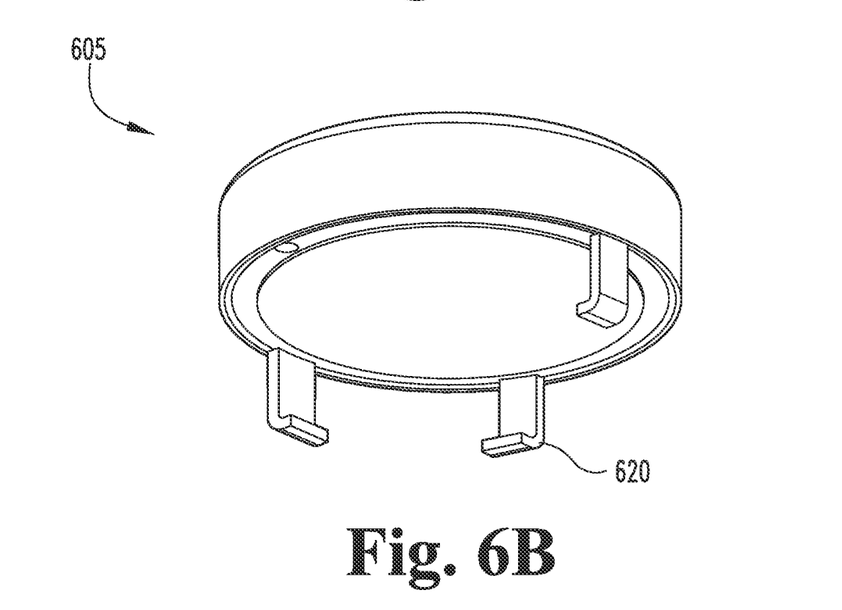
FIG. 6B second perspective view of an LED module including auxiliary LED module electrical connection(s).

FIGS. 6A-6B depict still another embodiment of the socket assembly typically including LED socket module 600, LED module 605, auxiliary socket electrical receiver(s) 610, and auxiliary LED module electrical connection(s) 620. Specifically, FIG. 6A depicts LED socket module 600 including auxiliary socket electrical receiver(s) 610, and FIG. 6B depicts LED module 605 including auxiliary LED module electrical connection(s) 620.

FIG. 6A depicts LED socket module 600 including auxiliary socket electrical receiver(s) 610. Auxiliary socket electrical receiver(s) 610 may be singular (as depicted in FIG. 6A) or numerous as desired. Auxiliary socket electrical receiver(s) 610 may interface with auxiliary LED module electrical connection(s) 620 and provide local and/or remote control (on, off, scheduled cycling, etc.), monitoring (temperature, energy usage, etc.), customization (color output, brightness, correlated color temperature (CCT), saturation, hue, etc.), and/or any other functionality as desired. For example, an operator may interface with LED socket module 600 and or LED module 605 to determine current and/or voltage draw, module(s) temperature, run time, historical statistics (e.g., longest run time, last power cycle, highest temperature, expected remaining module life, total power draw, monthly power draw, etc.), etc. In other implementations, auxiliary socket electrical receiver(s) 610 may be provide protection features for assembly components. For example, auxiliary socket electrical receiver(s) 610 may provide wholly or partially automated and/or programmable feedback and control via auxiliary socket electrical receiver(s) 610 including, but not limited to, foldback current limiting, thermal cutout, short-circuit protection, under- and/or over-voltage protection, under- and/or over-current protection, etc. In some implementations, LED socket module 600 may be similar in design to previously described LED socket module embodiments (e.g., socket module 120, LED socket module 220, LED socket module 400, etc.) or may vary—in whole or in part—from said embodiments. Similarly, in other implementations, auxiliary socket electrical receiver(s) 610 may be similar in design to previously described LED socket receiver embodiments (e.g., socket electrical receivers 125, socket electrical receivers 320, etc.) or may vary—in whole or in part—from said embodiments.

FIG. 6B depicts LED module 605 including auxiliary LED module electrical connection(s) 620. As described above, auxiliary LED module electrical connection(s) 620 may be singular (as depicted in FIG. 6A) or numerous as desired; may interface with auxiliary socket electrical receiver(s) 610 to provide local and/or remote control, monitoring, customization, etc.; and LED module 605 may be similar in design to previously described LED module embodiments (e.g., LED module 105, LED module 210, etc.) or may vary—in whole or in part—from said embodiments. Similarly, in other implementations, auxiliary LED module electrical connection(s) 620 may be similar in design to previously described LED electrical connection embodiments (e.g., LED electrical connections 115, LED module electrical connections 530, etc.) or may vary—in whole or in part—from said embodiments.

Figure 7:
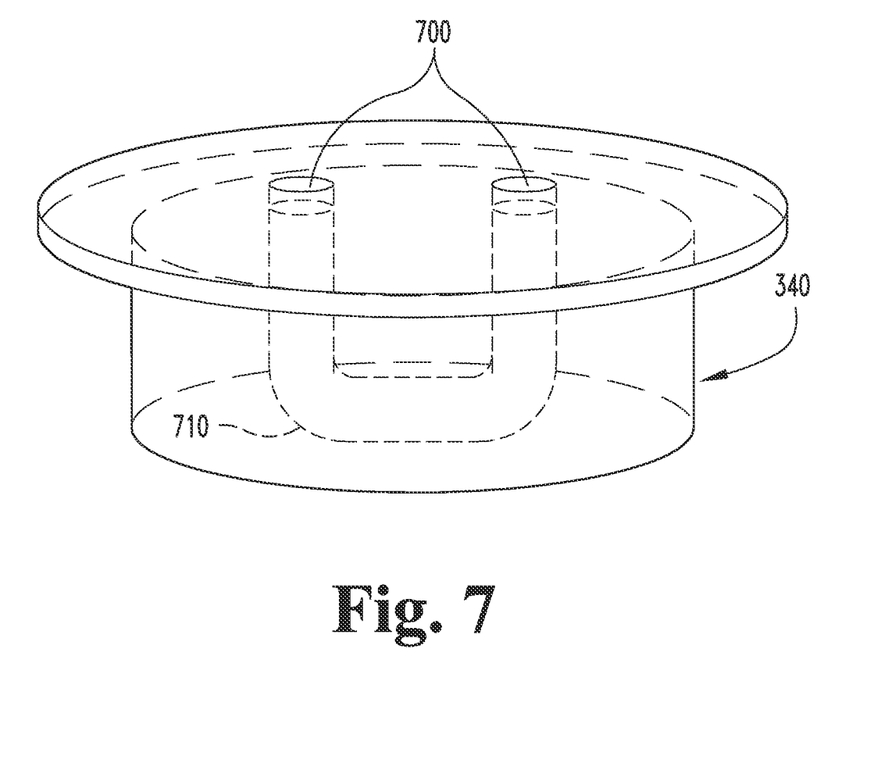
FIG. 7 is a perspective view of a heat-dissipating element including active-cooling.

FIG. 7 depicts heatsink base 340 including fluid ports 700 (opening(s); fluid aperture(s)) and fluid passage(s) 710 (conduits(s); tube(s); channel(s)). Typically, fluid ports 700 provide fluidic ingress and/or egress through heatsink base 340 via fluid passage(s) 710. Fluid ports 700 may directly accept fluid to fluid passage(s) 710 (i.e., fluid ports 700 may be integral with fluid passage(s) 710) or may provide attachment between a fluid source and fluid passage(s) 710. For example, fluid ports 700 may be threaded to accept fittings, while in other implementations fluid ports 700 may be the ends of fluid passage(s) 710 (i.e., fluid passage(s) may be a copper pipe extending through heatsink base 340 and terminating on both pipe ends as open copper pipe extending from the heatsink base 340). There may be only two fluid ports 700, as depicted, but there may be as many as desired. For example, there may be only one fluid port 700 (e.g., as might occur with a heatpipe), while in other implementations there may be dozens or hundreds of fluid ports 700 (e.g., to transfer a large quantity of fluid, to receive numerous fluid sources, to displace great volumes of thermal energy, etc.)

Fluid flowing through the fluid passage(s) 710 may absorb thermal energy from the heatsink base 340 (which may in turn be in thermal communication with an LED module producing thermal energy) and relocate that absorbed thermal energy to a remote heat-dissipation member (not shown). For example, the remote heat-dissipation member may be a radiator in fluidic and thermal communication with the fluid, a condenser unit, etc. In some implementations, the fluid ports 700 and fluid passage(s) 710 may include and/or be a heatpipe. There may be a singular fluid passage 710 or there may be multiple fluid passages 710 as desired. For example, there may be four fluid ports 700 and two separate fluid passages 710, while in other implementations these two separate fluid passages 710 may be combined to form a fluidic manifold. In some implementations, fluid ports 700 and/or fluid passage(s) 710 may include flow modifiers (e.g., nozzles, jets, valves, etc.).

In still other implementations, fluid passage(s) 710 and/or heatsink base 340 may include increased surface area regions for increasing thermal communication and transfer. For example, the walls of fluid passage(s) 710 may be formed with fins to increase surface area of fluid passage(s) 710. In another example, the heatsink base 340 may include a cavity formed therein—including or separate from fluid passage(s) 710—in fluidic communication with fluid passage(s) 710 and/or fluid ports 700, wherein the cavity includes a plate formed with a plurality of heat-dissipating structures (e.g., pins, fins, ridges, etc.) to increase surface area in contact with fluid.

While the novel technology has been illustrated and described in detail in the drawings and foregoing description, the same is to be considered as illustrative and not restrictive in character. It is understood that the embodiments have been shown and described in the foregoing specifications in satisfaction of the best mode and enablement requirements. It is further understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the novel technology are desired to be protected.

While a particular embodiment of the present invention has been shown and described, modifications may be made. It is therefore intended in the appended claims to cover such changes and modifications that follow in the true spirit and scope of the invention.

I claim:

1. An LED lighting device, comprising:
    an LED module; and
    an LED socket module operationally connected to the LED module and a driver;
    wherein the LED module further comprises:
    an LED;
    at least two LED module electrical connections in electrical communication with the LED and in electrical communication with at least two socket electrical receivers; and
    an LED thermal contact connected to and in thermal communication with the LED and with a heatsink base;
    wherein the LED socket module comprises:
    the at least two socket electrical receivers in electrical communication with the at least two LED module electrical connections and in electrical communication with the driver;
    a contact ring at least partially enclosing the at least two socket electrical receivers;
    a locking ring securing the LED module to the LED socket module;
    a cover at least partially enclosing the at least two socket electrical receivers, the contact ring, the locking ring, and the heatsink base;
    the heatsink base extending through the contact ring, the locking ring, and the cover;
    a differentiation receiver formed in the cover;
    wherein supplying the driver with an electric potential causes the LED to emit photons;
    wherein each of the at least two socket electrical receivers is uniquely sized; and
    wherein each of the at least two LED module electrical connections is uniquely sized to properly mate with each of the at least two socket electrical receivers that is uniquely sized to create a polarity-specific electrical connection.

2. The LED lighting device of claim 1, further comprising:
    at least one active cooling member in thermal communication with the heatsink base.

3. The LED lighting device of claim 1, further comprising:
    at least one fluid aperture at least partially formed in the heatsink base; and
    at least one fluid channel at least partially formed in the heatsink base and in fluidic communication with the at least one fluid aperture.

4. The LED lighting device of claim 1, further comprising:
    at least one differentiation element operationally connected to the LED module.

* * * * *